US009742358B2

(12) United States Patent
Shimamoto

(10) Patent No.: US 9,742,358 B2
(45) Date of Patent: Aug. 22, 2017

(54) POWER AMPLIFICATION CIRCUIT

(71) Applicant: MURATA MANUFACTURING CO., LTD., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/365,164

(22) Filed: Nov. 30, 2016

(65) Prior Publication Data
US 2017/0163223 A1 Jun. 8, 2017

(30) Foreign Application Priority Data
Dec. 2, 2015 (JP) ................. 2015-235983

(51) Int. Cl.
H03G 3/30 (2006.01)
H03F 1/30 (2006.01)
H03F 3/19 (2006.01)
H03F 3/21 (2006.01)
H03F 1/56 (2006.01)

(52) U.S. Cl.
CPC .............. *H03F 1/303* (2013.01); *H03F 1/56* (2013.01); *H03F 3/19* (2013.01); *H03F 3/21* (2013.01); *H03F 2200/222* (2013.01); *H03F 2200/387* (2013.01); *H03F 2200/411* (2013.01); *H03F 2200/451* (2013.01); *H03F 2200/516* (2013.01); *H03F 2200/555* (2013.01)

(58) Field of Classification Search
CPC .................................. H03G 3/30; H03F 3/20
USPC .................................................. 330/296, 285
See application file for complete search history.

(56) References Cited

U.S. PATENT DOCUMENTS

| 6,414,553 | B1 | 7/2002 | Luo | |
|---|---|---|---|---|
| 8,138,836 | B2* | 3/2012 | Matsuzuka | ............... H03F 3/16 330/285 |
| 2004/0150479 | A1 | 8/2004 | Abe | |
| 2011/0187459 | A1* | 8/2011 | Matsuzuka | ............... H03F 3/16 330/296 |
| 2013/0321086 | A1 | 12/2013 | Iizuka et al. | |
| 2014/0375390 | A1* | 12/2014 | Schooley | ................. H03F 3/21 330/296 |

(Continued)

FOREIGN PATENT DOCUMENTS

| JP | H11-17562 A | 1/1999 |
|---|---|---|
| JP | 2004-236173 A | 8/2004 |
| JP | 2005-501458 A | 1/2005 |

*Primary Examiner* — Henry Choe
(74) *Attorney, Agent, or Firm* — Pearne & Gordon, LLP

(57) ABSTRACT

A power amplification circuit includes: a first amplification transistor, a first signal being input to a base or gate thereof and a second signal obtained by amplifying the first signal being output from a collector or drain thereof; and a first bias circuit that supplies a first bias current to the base or gate of the first amplification transistor. The first bias circuit includes a first transistor that outputs the first bias current from an emitter or source thereof, and a first control circuit that controls an electrical connection between the emitter or source of the first transistor and ground. The first control circuit includes a first resistance element and a first switch element, which are connected in series with each other. The first switch element is switched on in the case of a first power mode and is switched off in the case of a second power mode.

16 Claims, 7 Drawing Sheets

(56) References Cited

U.S. PATENT DOCUMENTS

2016/0197586 A1* 7/2016 Ripley .................. H03F 1/22
 330/296

* cited by examiner

POWER AMPLIFICATION CIRCUIT

This application claims priority from Japanese Patent Application No. 2015-235983 filed on Dec. 2, 2015. The contents of this application are incorporated herein by reference in its entirety.

BACKGROUND

The present disclosure relates to power amplification circuits.

A power amplification circuit is used in a mobile communication device such as a cellular phone in order to amplify the power of a radio frequency (RF) signal to be transmitted to a base station. A bias circuit is used in such a power amplification circuit. The bias circuit is for supplying a bias current to a power amplification transistor. For example, Japanese Unexamined Patent Application Publication (Translation of PCT Application) No. 2005-501458 discloses a power amplification circuit that uses a bias circuit formed of a cascode current mirror circuit.

The bias circuit disclosed in Japanese Unexamined Patent Application Publication (Translation of PCT Application) No. 2005-501458 includes a transistor (Q3) that outputs a bias current from the emitter thereof and a transistor (Q2) that is connected to a ground-side of the transistor (Q3). An amplification transistor (Q1) is charged by the transistor (Q3) and is discharged by the transistor (Q2). The discharging speed of the transistor (Q2) is somewhat higher than or equal to the charging speed of the transistor (Q3) when the output power (input power) is low. On the other hand, as the output power (input power) increases, the discharging speed of the transistor (Q2) becomes lower than the charging speed of the transistor (Q3). Thus, the base voltage of the amplification transistor (Q1) at the time of a high output power increases and linearity of the amplification transistor (Q1) is improved. However, in this bias circuit, current consumption is increased due to a current flowing through the transistor (Q2) at the time of a low output power.

BRIEF SUMMARY

The present disclosure was made in light of the above-described circumstances and the present disclosure provides a power amplification circuit that can reduce current consumption while suppressing degradation of gain characteristics in the power amplification circuit.

A power amplification circuit according to an embodiment of the present disclosure includes: a first amplification transistor, a first signal being input to a base or gate thereof and a second signal obtained by amplifying the first signal being output from a collector or drain thereof; and a first bias circuit that supplies a first bias current to the base or gate of the first amplification transistor. The first bias circuit includes a first transistor that has a power supply voltage supplied to a collector or drain thereof, has a prescribed voltage supplied to a base or gate thereof and that outputs the first bias current from an emitter or source thereof, and a first control circuit that controls an electrical connection between the emitter or source of the first transistor and ground. The first control circuit includes a first resistance element and a first switch element, which are connected in series with each other. The first switch element is switched on in the case of a first power mode and is switched off in the case of a second power mode, in which the power amplification circuit operates at a lower output power than in the first power mode, in accordance with a control signal that represents a power mode.

A power amplification circuit can be provided to reduce current consumption while suppressing degradation of gain characteristics in the power amplification circuit.

Other features, elements, characteristics and advantages of the present disclosure will become more apparent from the following detailed description of preferred embodiments of the present disclosure with reference to the attached drawings.

DETAILED DESCRIPTION

Figure 1:
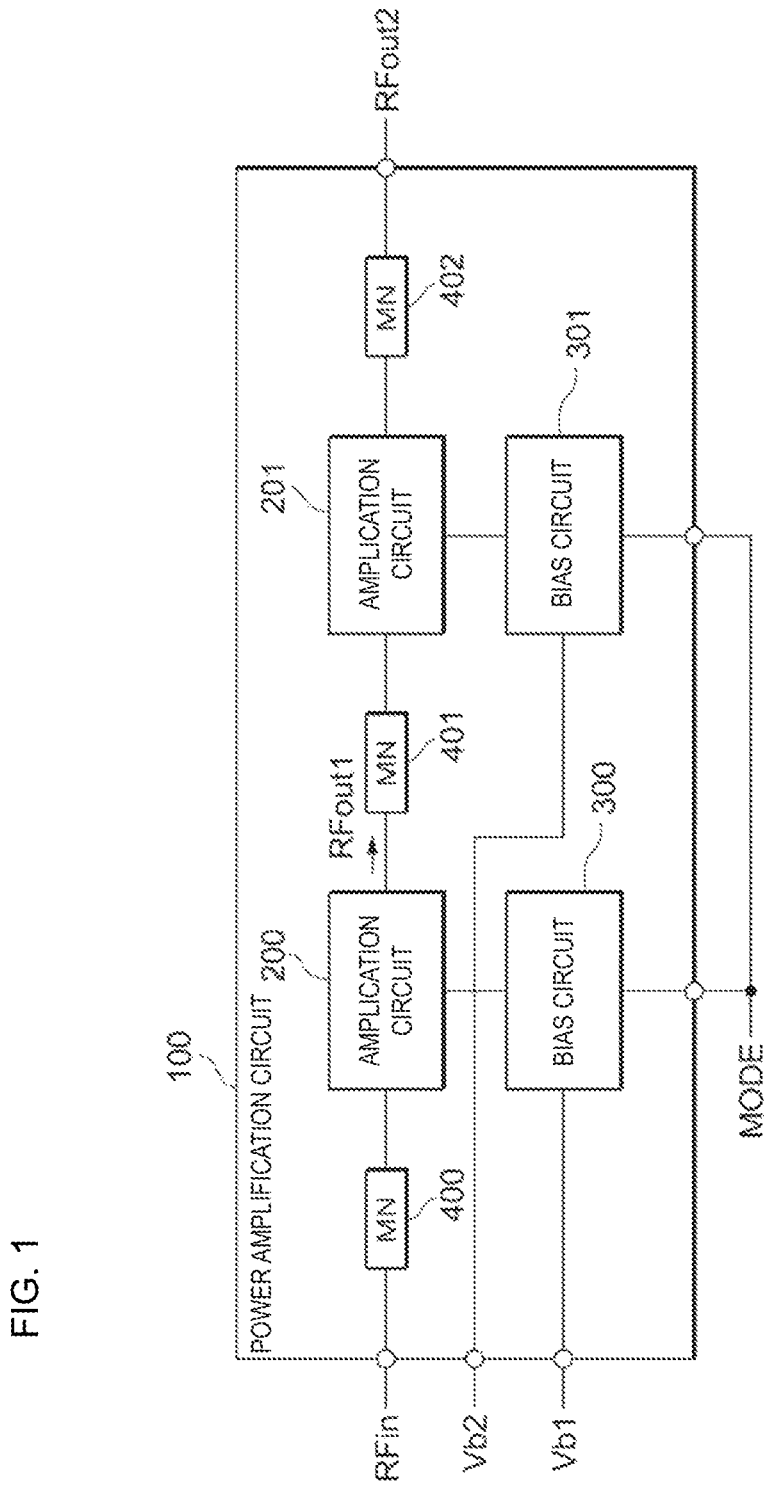
FIG. 1 illustrates the configuration of a power amplification circuit according to an embodiment of the present disclosure.

Hereafter, embodiments of the present disclosure will be described in detail while referring to the drawings. In addition, elements that are the same as each other will be denoted by the same symbols and repeated description thereof will be omitted.

FIG. 1 illustrates the configuration of a power amplification circuit 100 according to an embodiment of the present disclosure. The power amplification circuit 100 amplifies a radio frequency (RF) signal RFin and outputs an amplified signal RFout2.

As illustrated in FIG. 1, the power amplification circuit 100 includes amplification circuits 200 and 201, bias circuits 300 and 301, and matching networks 400, 401 and 402.

The amplification circuits 200 and 201 form a two-stage amplification circuit. The amplification circuit 200 amplifies the RF signal RFin (third signal) and outputs an RF signal RFout1 (first signal). The RF signal RFout1 output from the amplification circuit 200 is input to the amplification circuit 201 via the matching network 401. The amplification circuit 201 amplifies the RF signal RFout1 and outputs the amplified signal RFout2 (second signal). The number of stages of the amplification circuit is not limited to two and may be one or three or more.

The bias circuits 300 and 301 generate bias currents in accordance with a control signal MODE supplied from outside the power amplification circuit 100 and supply the generated bias currents to the amplification circuits 200 and 201. The gain of the power amplification circuit 100 is controlled by controlling the bias currents. The configurations of the amplification circuits 200 and 201 and the bias circuits 300 and 301 will be described in detail later.

The matching networks 400, 401 and 402 are provided in order to match the impedances between the individual circuits. The matching networks 400, 401 and 402 are formed using inductors and capacitors, for example.

Figure 2:
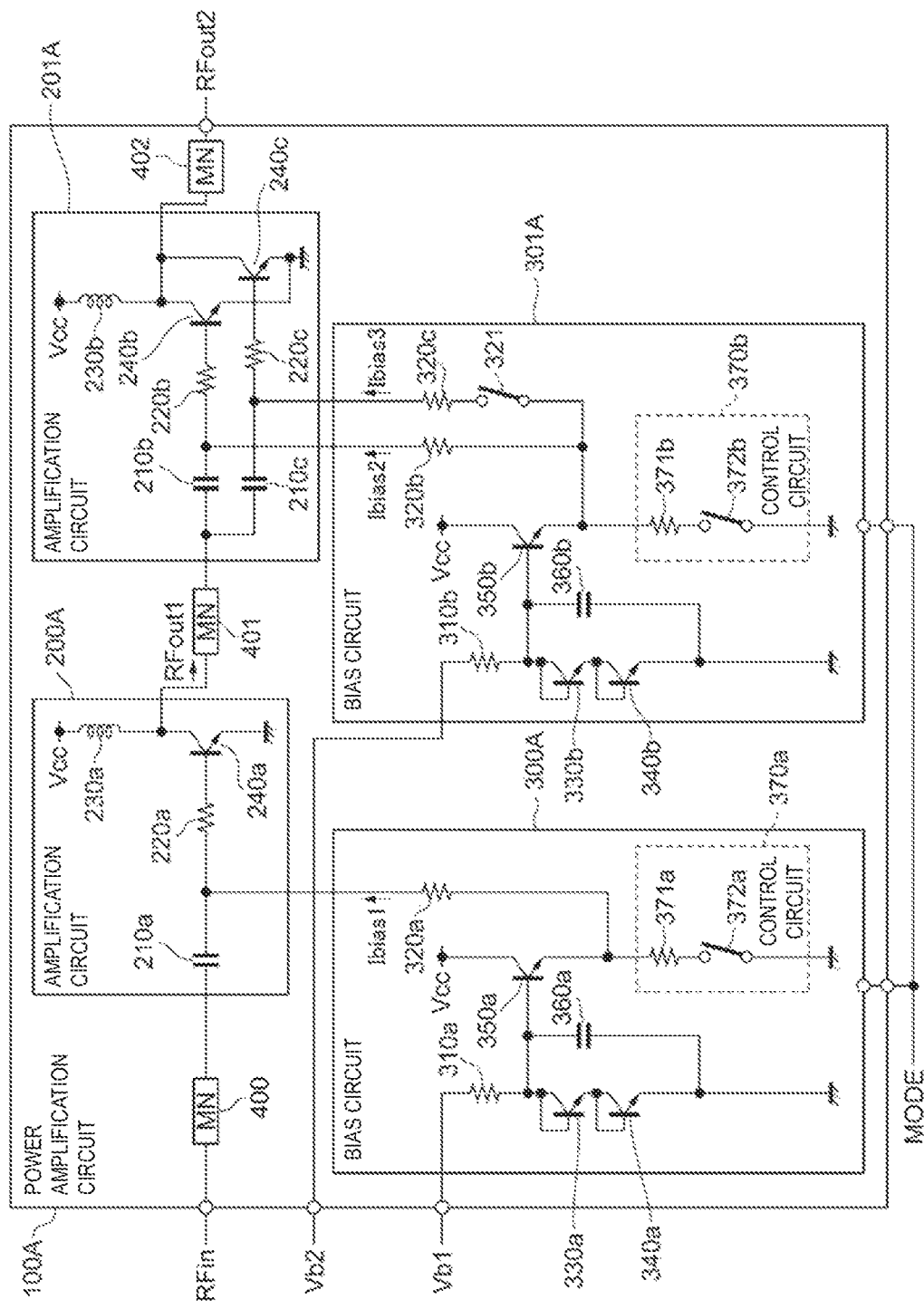
FIG. 2 illustrates an example configuration of the power amplification circuit.

FIG. 2 illustrates an example configuration (power amplification circuit 100A) of the power amplification circuit 100 according to an embodiment of the present disclosure.

As illustrated in FIG. 2, the power amplification circuit 100A includes amplification circuits 200A and 201A, bias circuits 300A and 301A and the matching networks 400, 401 and 402. The transistors included in the power amplification circuit 100A are heterojunction bipolar transistors (HBTs), for example.

The amplification circuit 200A includes a capacitor 210a, a resistance element 220a, an inductor 230a and a bipolar transistor 240a.

The RF signal RFin is supplied to a first terminal of the capacitor 210a via the matching network 400 from outside the amplification circuit 200A and a second terminal of the capacitor 210a is connected to a first terminal of the resistance element 220a. The capacitor 210a removes a direct-current-component voltage from the RF signal RFin.

The first terminal of the resistance element 220a is connected to the second terminal of the capacitor 210a and a second terminal of the resistance element 220a is connected to the base of the bipolar transistor 240a.

A power supply voltage Vcc is supplied to a first terminal of the inductor 230a and a second terminal of the inductor 230a is connected to the collector of the bipolar transistor 240a.

The power supply voltage Vcc is supplied to the collector of the bipolar transistor 240a (second amplification transistor) via the inductor 230a, the base of the bipolar transistor 240a is connected to the second terminal of the resistance element 220a and the bipolar transistor 240a has a common emitter. The RF signal RFin supplied from outside the amplification circuit 200A and a bias current Ibias1 (third bias current) output from the bias circuit 300A are supplied to the base of the bipolar transistor 240a. As a result, the RF signal RFout1, which is obtained by amplifying the RF signal RFin, is output from the collector of the bipolar transistor 240a. The gain characteristics of the bipolar transistor 240a are controlled in accordance with the bias current Ibias1 supplied from the bias circuit 300A.

An N-channel MOSFET may be used as the bipolar transistor 240a instead of a bipolar transistor. This is also the case for the other bipolar transistors described below. When an N-channel MOSFET is used instead of a bipolar transistor, "collector", "base" and "emitter" should be respectively read as "drain", "gate" and "source".

The amplification circuit 201A includes capacitors 210b and 210c, resistance element 220b and 220c, an inductor 230b and bipolar transistors 240b (first amplification transistor) and 240c.

In the amplification circuit 201A, two amplification paths are connected in parallel with each other. Specifically, the capacitor 210b, the resistance element 220b, the inductor 230b and the bipolar transistor 240b form one amplification path and the capacitor 210c, the resistance element 220c, the inductor 230b and the bipolar transistor 240c form another amplification path. In addition, a first terminal of the capacitor 210b is connected to a first terminal of the capacitor 210c. Bias currents Ibias2 (first bias current) and Ibias3 output from the bias circuit 301A are respectively supplied to the bases of the bipolar transistors 240b and 240c. The configurations of these amplification paths are the same as the amplification path in the amplification circuit 200A and therefore detailed description thereof is omitted.

The amplification circuit 201A is configured to be able to employ two parallel-connected amplification paths in accordance with the size of the output power of the amplified signal RFout2. Specifically, when the power amplification circuit 100A operates in a high power mode (first power mode) in which the power of the amplified signal RFout2 is higher than a prescribed value, the power amplification circuit 100A uses both the amplification path that includes the bipolar transistor 240b and the amplification path that includes the bipolar transistor 240c. The power amplification circuit 100A is configured to be able to use only one of the amplification path that includes the bipolar transistor 240b and the amplification path that includes the bipolar transistor 240c when the power amplification circuit 100A operates in a low power mode (second power mode) in which the power of the amplified signal RFout2 is lower than the prescribed value. In the power amplification circuit 100A, an example configuration is illustrated in which only the amplification path that includes the bipolar transistor 240b is used at the time of the low power mode.

Switching of the amplification paths in accordance with the power mode can be performed by operation of a switch element 321 included in the bias circuit 301A. Operation of the switch element 321 will be described in detail later.

With the above-described configuration, the amplified signal RFout2 (second signal), which is obtained by amplifying the RF signal RFout1 (first signal), is output from the collectors of the bipolar transistors 240b and 240c in the amplification circuit 201A. The gain characteristics of the bipolar transistors 240b and 240c are controlled in accordance with the bias currents Ibias2 and Ibias3 supplied from the bias circuit 301A.

Although a configuration has been described for the power amplification circuit 100A in which the amplification circuit 200A has one amplification path and the amplification circuit 201A has two amplification paths, the amplification circuits 200A and 201A may each be configured to have one or a plurality of amplification paths.

Next, the bias circuit 300A will be described. The bias circuit 300A (second bias circuit) includes resistance elements 310a and 320a, bipolar transistors 330a, 340a and 350a, a capacitor 360a and a control circuit 370a.

The resistance element 310a, the bipolar transistors 330a and 340a and the capacitor 360a are configured so as to generate a voltage of a prescribed level. Specifically, a bias control voltage Vb1 is supplied to a first terminal of the resistance element 310a and a second terminal of the resistance element 310a is connected to the collector of the bipolar transistor 330a. The collector and the base of the bipolar transistor 330a are connected to each other (hereafter, "diode connected"), the collector of the bipolar transistor 330a is connected to the second terminal of the resistance element 310a and the emitter of the bipolar transistor 330a is connected to the collector of the bipolar transistor 340a. The bipolar transistor 340a is diode connected, the collector thereof is connected to the emitter of the bipolar transistor 330a and the emitter of the bipolar transistor 340a is connected to the ground. A first terminal of the capacitor 360a is connected to the second terminal of the resistance element 310a and to the collector of the bipolar transistor 330a, and a second terminal of the capacitor 360a is grounded.

With the above-described configuration, a voltage of a prescribed level (for example, around 2.6 V) is generated at the collector of the bipolar transistor 330a.

A first terminal of the resistance element 320a is connected to the emitter of the bipolar transistor 350a, and a second terminal of the resistance element 320a is connected to the second terminal of the capacitor 210a and to the first terminal of the resistance element 220a.

The power supply voltage Vcc is supplied to the collector of the bipolar transistor 350a (third transistor), the base of the bipolar transistor 350a is connected to the collector of the bipolar transistor 330a and the emitter of the bipolar transistor 350a is connected to an input terminal (first terminal of resistance element 371a) of the control circuit 370a. In addition, the emitter of the bipolar transistor 350a is connected to the base of the bipolar transistor 240a via the resistance element 320a and the resistance element 220a of the amplification circuit 200A and supplies the bias current Ibias1.

Next, the control circuit 370a will be described. The control circuit 370a (fourth control circuit) includes the resistance element 371a and a switch element 372a.

The first terminal of the resistance element 371a (third resistance element) is connected to the emitter of the bipolar transistor 350a and a second terminal of the resistance element 371a is connected to a first terminal of the switch element 372a.

The first terminal of the switch element 372a (third switch element) is connected to the second terminal of the resistance element 371a and a second terminal of the switch element 372a is grounded.

The switch element 372a is switched on or off in accordance with the control signal MODE, which represents the power mode of the power amplification circuit 100A. Specifically, when the power mode of the power amplification circuit 100A is the high power mode, the switch element 372a is switched on and operates so as to electrically connect the emitter of the bipolar transistor 350a and the ground. On the other hand, when the power mode of the power amplification circuit 100A is the low power mode, the switch element 372a is switched off and operates so as to sever the electrical connection between the emitter of the bipolar transistor 350a and the ground.

With the above-described configuration, when the power amplification circuit 100A operates in the high power mode, a current flows from the emitter of the bipolar transistor 350a to ground via the resistance element 371a. Therefore, in the case where, at the time of the high power mode, the base current of the bipolar transistor 240a rises in accordance with the amplitude of the RF signal RFout1 and a larger bias current is needed, the current that flows to the resistance element 371a in advance can be routed to the base of the bipolar transistor 240a. Thus, at the time of the high power mode, degradation of gain characteristics caused by an insufficient bias current can be reduced.

On the other hand, when the power amplification circuit 100A operates in the low power mode, a current does not flow from the emitter of the bipolar transistor 350a to ground. Here, comparing the operation at the time of the low power mode to the operation at the time of the high power mode, since the size of the required bias current is small at the time of the low power mode, the gain characteristics are not greatly affected if a current does not flow to the resistance element 371a in advance. Therefore, current consumption can be reduced by switching the switch element 372a off at the time of the low power mode.

Next, the bias circuit 301A will be described. In addition to including the constituent components of the bias circuit 300A (resistance elements 310b and 320b, bipolar transistors 330b, 340b and 350b (first transistor), capacitor 360b and control circuit 370b), the bias circuit 301A (first bias circuit) further includes a resistance element 320c and the switch element 321.

The control circuit 370b (first control circuit) includes a resistance element 371b (first resistance element) and a switch element 372b (first switch element). The configuration of the control circuit 370b is the same as that of the control circuit 370a and therefore detailed description thereof is omitted.

A first terminal of the resistance element 320c is connected to a first terminal of the switch element 321 and a second terminal of the resistance element 320c is connected to a second terminal of the capacitor 210c and a first terminal of the resistance element 220c.

The first terminal of the switch element 321 is connected to the first terminal of the resistance element 320c and a second terminal of the switch element 321 is connected to a first terminal of the resistance element 320b.

The switch element 321 is switched on and off in accordance with the control signal MODE and controls switching on/off of the bias current Ibias3. Specifically, when the power amplification circuit 100A operates in the high power mode, the switch element 321 is switched on, the bias current Ibias3 is supplied to the base of the bipolar transistor 240c and the bipolar transistor 240c is switched on. On the other hand, when the power amplification circuit 100A operates in the low power mode, the switch element 321 is switched off, the bias current Ibias3 is not supplied to the base of the bipolar transistor 240c and the bipolar transistor 240c is switched off. Switching of the two amplification paths corresponding to the power modes can be performed in the amplification circuit 201A by controlling the supply of the bias currents in this way.

The rest of the configuration of the bias circuit 301A is the same as that of the bias circuit 300A and therefore detailed description thereof is omitted.

With the above-described configuration, the bias circuit 301A can generate the bias currents Ibias2 and Ibias3 that correspond to a bias control voltage Vb2 and supply the generated bias currents Ibias2 and Ibias3 to the bases of the bipolar transistors 240b and 240c. In addition, since the bias circuit 301A includes the control circuit 370b, similarly to the bias circuit 300A including the control circuit 370a, current consumption can be reduced while preventing degradation of gain characteristics.

As described above, since the power amplification circuit 100A includes the bias circuits 300A and 301A, current consumption of the power amplification circuit 100A as a whole can be reduced while preventing degradation of the gain characteristics.

Although a configuration is adopted in which the bias circuits 300A and 301A of the amplification circuits 200A and 201A include the control circuits 370a and 370b in the power amplification circuit 100A, a configuration may instead be adopted in which only one of the bias circuits includes a control circuit.

Figure 3:
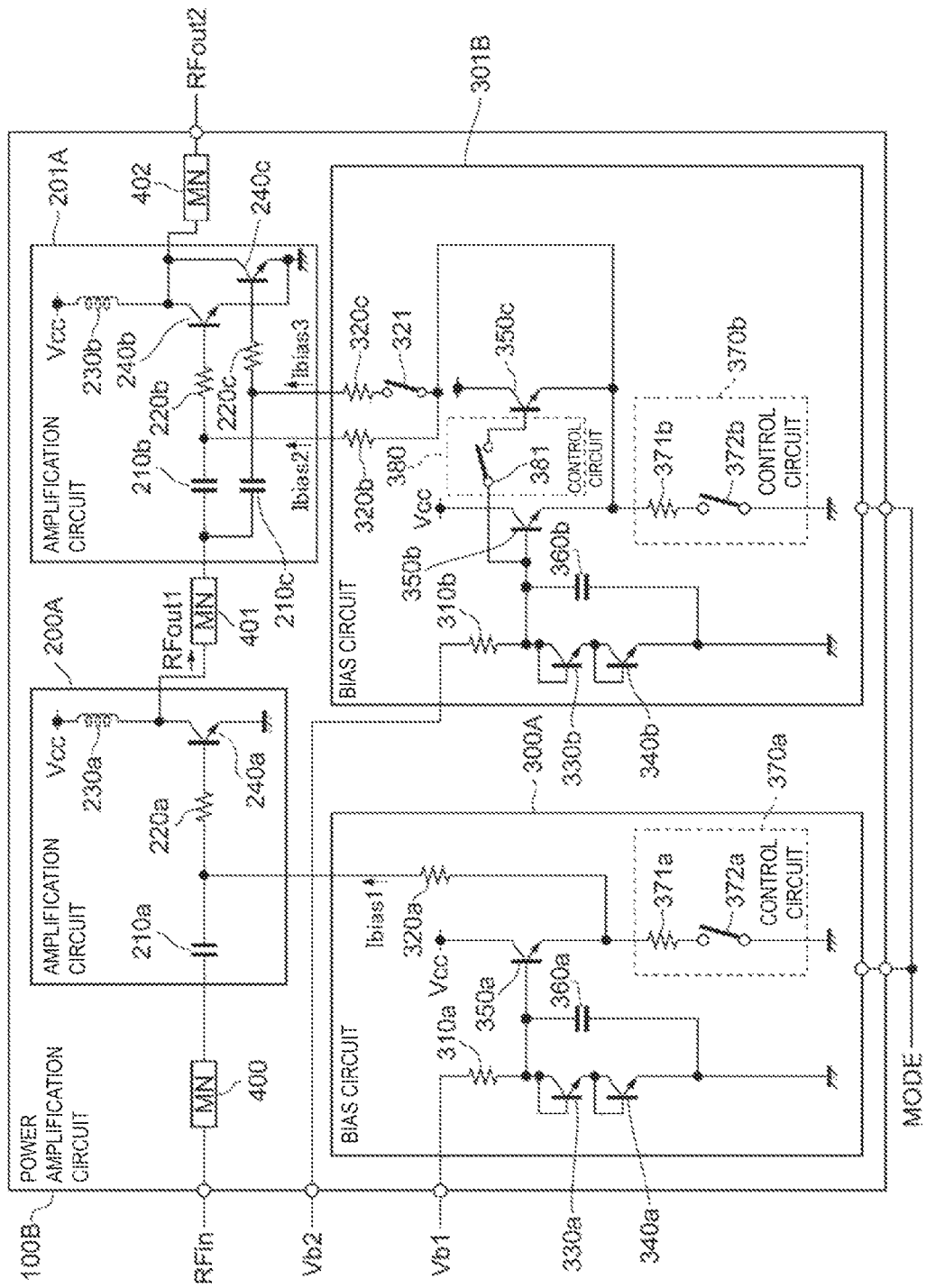
FIG. 3 illustrates another example configuration of the power amplification circuit.

FIG. 3 illustrates another example configuration (power amplification circuit 100B) of the power amplification circuit 100. Elements that are the same as those of the power amplification circuit 100A are denoted by the same symbols and description thereof is omitted. The power amplification circuit 100B includes a bias circuit 301B instead of the bias circuit 301A of the power amplification circuit 100A.

In addition to including the constituent components of the bias circuit 301A, the bias circuit 301B further includes a bipolar transistor 350c and a control circuit 380.

The power supply voltage Vcc is supplied to the collector of the bipolar transistor 350c (second transistor), the base of the bipolar transistor 350c is connected to a first terminal of a switch element 381 and the emitter of the bipolar transistor 350c is connected to an input terminal (first terminal of resistance element 371b) of the control circuit 370b. In addition, the emitter of the bipolar transistor 350c supplies a bias current (second bias current) to the bases of the bipolar transistor 240b and 240c via the resistance elements 320b and 320c and the resistance elements 220b and 220c of the amplification circuit 201A.

The control circuit 380 (second control circuit) includes the switch element 381.

The first terminal of the switch element 381 is connected to the base of the bipolar transistor 350c and a second terminal of the switch element 381 is connected to the base of the bipolar transistor 350b.

The size of the bias current supplied by the bias circuit 301B can be controlled by switching the switch element 381 of the control circuit 380 on and off in accordance with the control signal MODE. Specifically, when the power mode of the power amplification circuit 100B is the high power mode, the switch element 381 is switched on and consequently the bipolar transistor 350c is switched on. Thus, a current is supplied from the emitter of the bipolar transistor 350c as well as from the emitter of the bipolar transistor 350b and the total bias circuit supplied by the bias circuit 301B is increased. In addition, as a result of the switch element 321 being switched on as described above, the bias current Ibias3 flows and the bipolar transistor 240c is driven. On the other hand, when the power mode of the power amplification circuit 100B is the low power mode, the switch element 381 is switched off and consequently the bipolar transistor 350c is switched off. In addition, as a result of the switch element 321 being switched off as described above, the bias current Ibias3 does not flow and the bipolar transistor 240c is not driven. Thus, it can be ensured that there is the appropriate amount of current when a large bias current is needed at the time of the high power mode.

Therefore, compared with the power amplification circuit 100A, the amplitude characteristics (AM-AM characteristics), the phase characteristics (AM-PM characteristics) and the distortion characteristics (adjacent channel leakage power ratio) of power amplification can be adjusted in the power amplification circuit 100B.

Although a configuration is illustrated for the control circuit 380 in which connection of the base of the bipolar transistor 350c is controlled in order to switch the bipolar transistor 350c on and off, a configuration may instead be adopted for the control circuit 380 in which connection of the collector or emitter of the bipolar transistor 350c is controlled.

In addition, although the power amplification circuit 100B has a configuration in which the bias circuit 301B includes the bipolar transistor 350c and the control circuit 380, a configuration may instead be adopted in which only the bias circuit 300A further includes the bipolar transistor 350c and the control circuit 380 or a configuration may be adopted in which both the bias circuits 300A and 301A further include the bipolar transistor 350c and the control circuit 380.

Figure 4:
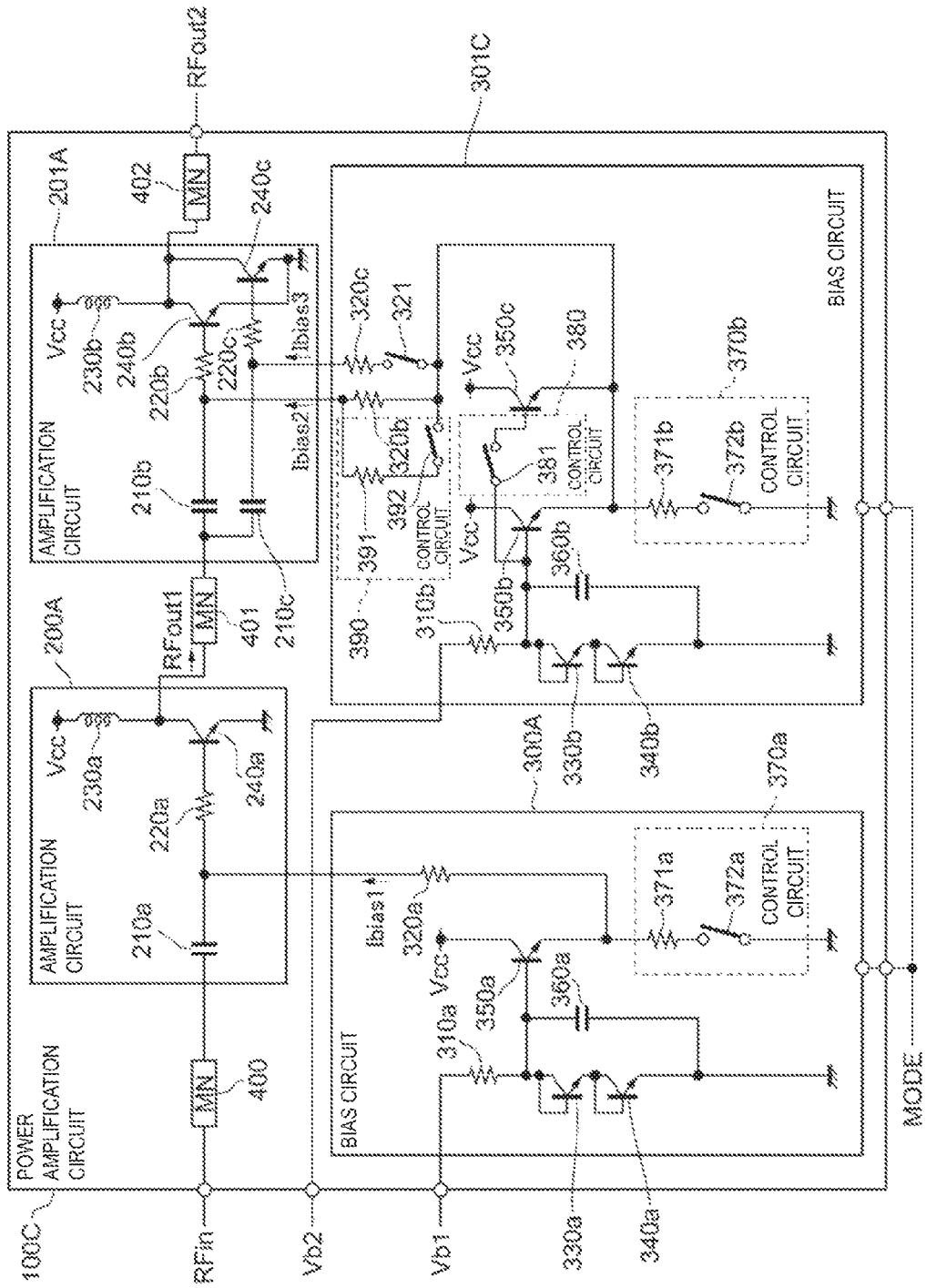
FIG. 4 illustrates another example configuration of the power amplification circuit.

FIG. 4 illustrates another example configuration (power amplification circuit 100C) of the power amplification circuit 100. Elements that are the same as those of the power amplification circuit 100B are denoted by the same symbols and description thereof is omitted. The power amplification circuit 100C includes a bias circuit 301C instead of the bias circuit 301B of the power amplification circuit 100B.

In addition to including the constituent elements of the bias circuit 301B, the bias circuit 301C further includes a control circuit 390.

The control circuit 390 (third control circuit) includes a resistance element 391 and a switch element 392.

A first terminal of the resistance element 391 (second resistance element) is connected to a first terminal of the switch element 392 and a second terminal of the resistance element 391 is connected to a second terminal of the resistance element 320b.

The first terminal of the switch element 392 (second switch element) is connected to the first terminal of the resistance element 391 and a second terminal of the switch element 392 is connected to the first terminal of the resistance element 320b.

In the control circuit 390, the switch element 392 is switched on and off in accordance with a bias control signal supplied from outside the bias circuit 301C and as a result, the size of the bias current Ibias2 can be controlled. Specifically, the combined resistance of the resistance element 320b and the resistance element 391 is reduced by switching the switch element 392 on. Thus, the size of the bias current Ibias2 increases and therefore the output power can be increased. On the other hand, the combined resistance of the resistance element 320b and the resistance element 391 is increased by switching the switch element 392 off. Thus, the size of the bias current Ibias2 decreases and therefore excessive power consumption can be suppressed and power efficiency can be improved. Thus, by equipping the bias circuit 301C with the control circuit 390, the resistance between the base of the bipolar transistor 240b and the emitters of the bipolar transistor 350b and 350c is adjustable and the characteristics of the amplification circuit 201A can be adjusted. Adjusting the characteristics in this way is particularly effective at the time of the high power mode, but may also be performed at the time of the low power mode.

As described above, compared with the power amplification circuit 100B, the characteristics of power amplification can be adjusted in the power amplification circuit 100C.

Although the power amplification circuit 100C has a configuration in which the bias circuit 301C includes the control circuit 390, a configuration may instead be adopted in which the bias circuit 301A further includes the control circuit 390. In addition, a configuration may be adopted in which the bias circuit 300A further includes the control circuit 390.

Next, simulation results of current consumption, gain characteristics and adjacent channel leakage ratio (ACLR) characteristics in the power amplification circuit 100A will be described while referring to FIGS. 5 to 7.

Figure 5:
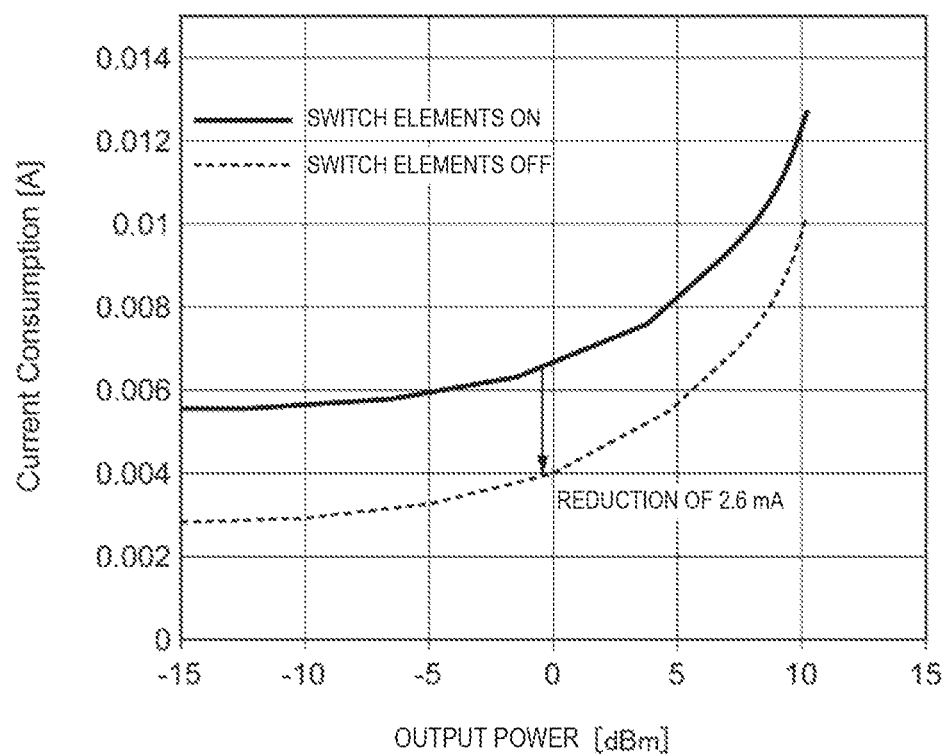
FIG. 5 is a graph illustrating simulation results of current consumption in a power amplification circuit.
Figure 6:
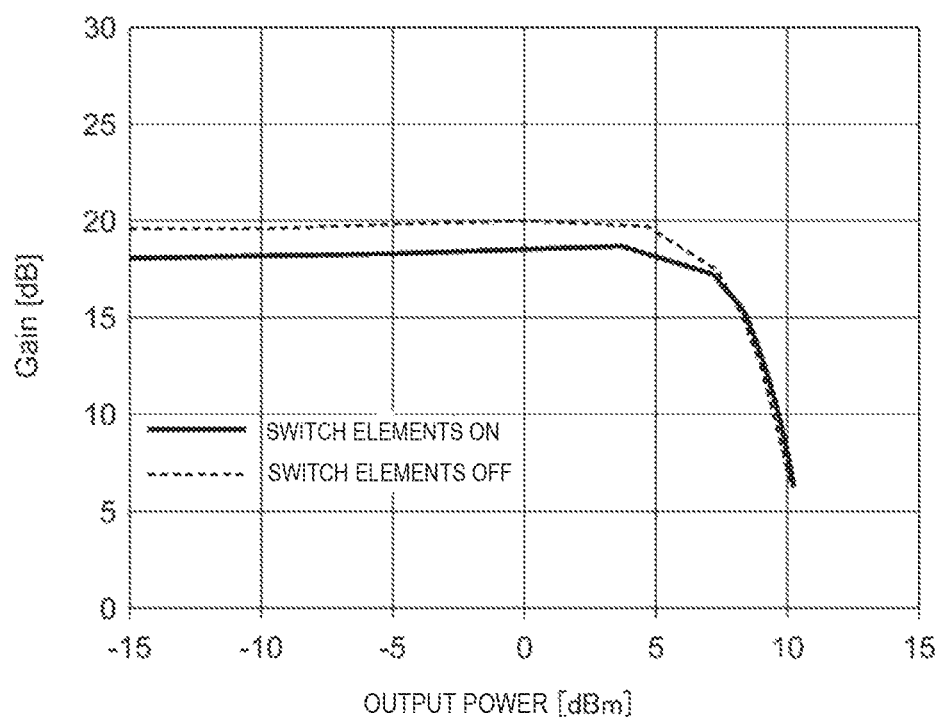
FIG. 6 is a graph illustrating simulation results of gain characteristics in a power amplification circuit.
Figure 7:
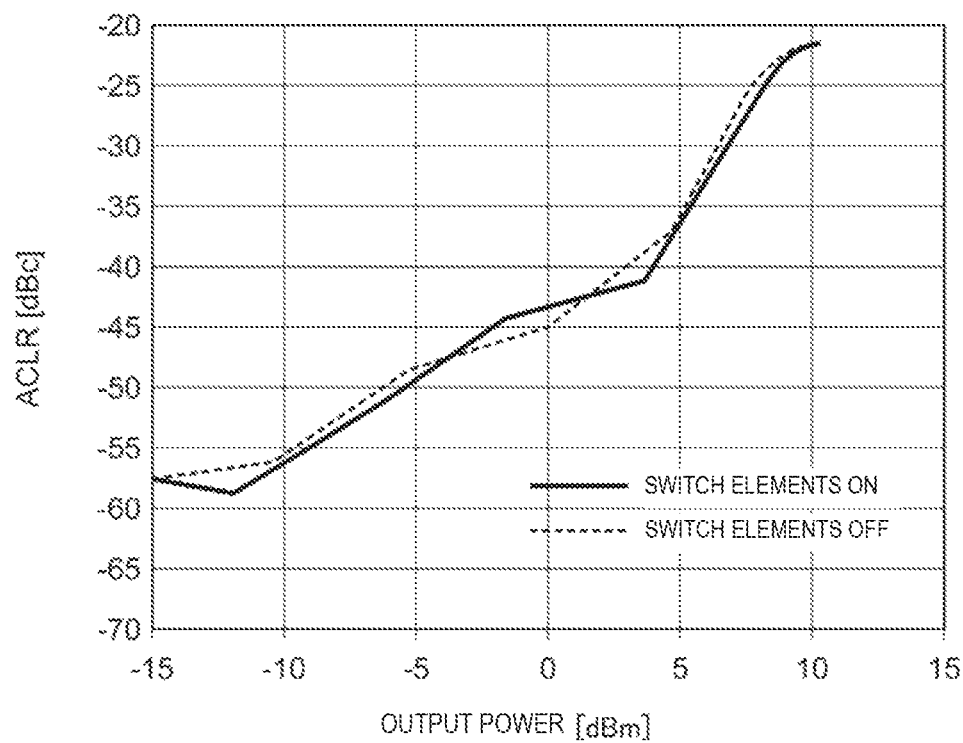
FIG. 7 is a graph illustrating simulation results of ACLR characteristics in a power amplification circuit.

The graphs depicted in FIGS. 5 to 7 illustrate comparative results obtained when the switch elements 372a and 372b of the control circuits 370a and 370b in the power amplification circuit 100A according to the embodiment of the present disclosure are switched on and off. FIGS. 5 to 7 illustrate simulation results obtained when the power supply voltage Vcc=0.52 V, the frequency of the RF signal RFin=814 MHz, the temperature is room temperature and the power mode of the power amplification circuit 100A is the low power mode.

FIG. 5 is a graph illustrating simulation results of current consumption in the power amplification circuit 100A at the time of the low power mode. In the graph illustrated in FIG. 5, the vertical axis represents current consumption (A) and the horizontal axis represents output power (dBm).

As illustrated in FIG. 5, it is clear that current consumption is reduced when the switch elements 372a and 372b are switched off compared with when the switch elements 372a and 372b are switched on. For example, the current consumption is reduced by around 2.6 mA when the output power is 0 dBm.

FIG. 6 is a graph illustrating simulation results of the gain characteristics in the power amplification circuit 100A at the time of the low power mode. In the graph illustrated in FIG. 6, the vertical axis represents gain (dB) and the horizontal axis represents output power (dBm).

As illustrated in FIG. 6, compared with the case where the switch element 372a and 372b are switched on, although the gain rises by around 1 dB, no change in the output level and no degradation such variations in the value of the gain can be seen when the switch elements 372a and 372b are switched off. In other words, it clear that providing the control circuits 370a and 370b does not greatly affect the gain characteristics (linearity).

FIG. 7 is a graph illustrating simulation results of the ACLR characteristics in the power amplification circuit 100A at the time of the low power mode. In the graph illustrated in FIG. 7, the vertical axis represents ACLR (dBc) and the horizontal axis represents output power (dBm).

As illustrated in FIG. 7, a large change in the ACLR characteristics cannot be seen when the switch elements 372a and 372b are switched off compared with when the switch elements 372a and 372b are switched on. In other words, it clear that providing the control circuits 370a and 370b does not greatly affect the ACLR characteristics.

It is clear from the above-described simulation results that by switching the switch elements 372a and 372b off when the power mode is the low power mode, it is possible to reduce current consumption while suppressing the effect on the gain characteristics and the ACLR characteristics so as to be small. In other words, the power amplification circuit 100A can reduce current consumption while suppressing degradation of the gain characteristics over the entire circuit of the power amplification circuit 100A.

Exemplary embodiments of the present disclosure have been described above. The bias circuits of the power amplification circuits 100A to 100C are provided with the control circuits 370a and 370b and as a result, a current is made to flow from the emitters of the bipolar transistors 350a and 350b to the ground when the power mode is the high power mode and the emitters of the bipolar transistors 350a and 350b are electrically disconnected from the ground when the power mode is the low power mode. Thus, degradation of the gain characteristics can be suppressed by securing a bias current of the required size at the time of the high power mode, and excess current consumption can be avoided while suppressing the effect on the gain characteristics at the time of the low power mode. Therefore, current consumption can be reduced while suppressing degradation of the gain characteristics over the entire power amplification circuit.

In addition, in the power amplification circuit 100B, a bias circuit is further equipped with the bipolar transistor 350c and the control circuit 380 and as a result, the size of a bias current can be controlled in accordance with the control signal MODE. Thus, it can be ensured that there is the appropriate size of current when a large bias current is needed at the time of the high power mode. Therefore, compared with the power amplification circuit 100A, the characteristics of power amplification can be adjusted in the power amplification circuit 100B.

In addition, in the power amplification circuit 100C, a bias circuit is further provided with the control circuit 390 and as a result, the resistance between the base of the bipolar transistor 240b and the emitters of the bipolar transistors 350b and 350c can be changed. Thus, it is possible to control the size of the bias current Ibias2 in accordance with a bias control signal. Therefore, compared with the power amplification circuit 100B, the characteristics of power amplification can be adjusted in the power amplification circuit 100C.

In addition, the power amplification circuits 100A to 100C are power amplification circuits that include a two-stage amplification circuit. By respectively using the control circuits 370a and 370b in the bias circuits 300 and 301, the effect of reducing current consumption can be improved compared with using a control circuit in just one of the bias circuits. The same would also be true for configurations having three or more stages.

In the power amplification circuits illustrated in FIGS. 2 to 4, N-channel MOSFETs may be used instead of bipolar transistors.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are to be also included in the present disclosure. In other words, appropriate design changes made to the embodiments by one skilled in the art are to be included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit comprising:
   a first amplification transistor, wherein a first signal is input to a base or gate of the first amplification transistor and a second signal obtained by amplifying the first signal is output from a collector or drain of the first amplification transistor; and
   a first bias circuit that supplies a first bias current to the base or gate of the first amplification transistor;
   wherein the first bias circuit includes
      a first transistor, wherein a power supply voltage is supplied to a collector or drain of the first transistor, a first prescribed voltage is supplied to a base or gate of the first transistor, and the first bias current is output from an emitter or source of the first transistor, and
      a first control circuit that controls an electrical connection between the emitter or source of the first transistor and ground,
   wherein the first control circuit includes
      a first resistor and a first switch connected in series with each other, and
   wherein the first switch is on when the power amplification circuit is in a high power mode and is off when the power amplification circuit is in a low power mode, the first switch being controlled in accordance with a control signal that represents a power mode.

2. The power amplification circuit according to claim 1, wherein the first bias circuit further includes
   a second transistor, wherein the power supply voltage is supplied to a collector or drain of the second transistor and a second bias current is output from an emitter or source of the second transistor to the base or gate of the first amplification transistor, and a second control circuit that controls the second transistor to be on when the power amplification circuit is in the high power mode and controls the second transistor to be off when the power amplification circuit is in the low power mode in accordance with the control signal.

3. The power amplification circuit according to claim 2, wherein the second control circuit comprises a switch connected between a base or gate of the second transistor and the base or gate of the first transistor.

4. The power amplification circuit according to claim 3, wherein the switch is controlled to supply the first prescribed voltage to the base or gate of the second transistor and to the base or gate of the first transistor, in accordance with the control signal.

5. The power amplification circuit according to claim 1, wherein the first bias circuit further includes a third control circuit that controls a resistance between the base or gate of the first amplification transistor and the emitter or source of the first transistor in accordance with a bias control signal supplied from outside of the first bias circuit.

6. The power amplification circuit according to claim 5, wherein the third control circuit includes a second resistor and a second switch provided between the base or gate of the first amplification transistor and the emitter or source of the first transistor, the second resistor and the second switch are connected in series with each other, and the second switch is controlled in accordance with the bias control signal.

7. The power amplification circuit according to claim 1, further comprising:

a second amplification transistor, wherein a third signal is input to a base or gate of the second amplification transistor, and the first signal, which is obtained by amplifying the third signal, is output from a collector or a drain of the second amplification transistor; and a second bias circuit that supplies a third bias current to a base or gate of the second amplification transistor;

wherein the second bias circuit includes a third transistor, wherein the power supply voltage is supplied to a collector or drain of the third transistor, a second prescribed voltage is supplied to a base or gate of the third transistor, and the third bias current is output from an emitter or source of the third transistor, and a fourth control circuit that controls an electrical connection between the emitter or source of the third transistor and ground, wherein the fourth control circuit includes a third resistor and a third switch connected in series with each other, and wherein the third switch is on when the power amplification circuit is in the high power mode and is off when the power amplification circuit is in the low power mode, the third switch being controlled in accordance with the control signal.

8. The power amplification circuit according to claim 7, wherein the second amplification transistor and the second bias circuit are part of a first amplification stage, and the first amplification transistor and the first bias circuit are part of a second amplification stage.

9. The power amplification circuit according to claim 1, further comprising a third amplification transistor, wherein the first amplification transistor and the third amplification transistor form parallel amplification paths for the first signal.

10. The power amplification circuit according to claim 9, wherein the first signal is input to a base or gate of the third amplification transistor and the second signal obtained by amplifying the first signal is output from a collector or drain of the third amplification transistor.

11. The power amplification circuit according to claim 10, wherein the first bias circuit supplies a fourth bias current to the base or gate of the third amplification transistor.

12. The power amplification circuit according to claim 11, further comprising a fourth resistor and a fourth switch connected in series between the emitter or source of the first transistor and the base or gate of the third amplification transistor, the fourth switch being controlled in accordance with the control signal.

13. The power amplification circuit according to claim 9, further comprising:

a second amplification transistor, wherein a third signal is input to a base or gate of the second amplification transistor, and the first signal, which is obtained by amplifying the third signal, is output from a collector or a drain of the second amplification transistor; and a second bias circuit that supplies a third bias current to a base or gate of the second amplification transistor;

wherein the second bias circuit includes a third transistor, wherein the power supply voltage is supplied to a collector or drain of the third transistor, a second prescribed voltage is supplied to a base or gate of the third transistor, and the third bias current is output from an emitter or source of the third transistor, and a fourth control circuit that controls an electrical connection between the emitter or source of the third transistor and ground, wherein the fourth control circuit includes a third resistor and a third switch connected in series with each other, and wherein the third switch is on when the power amplification circuit is in the high power mode and is off when the power amplification circuit is in the low power mode, the third switch being controlled in accordance with the control signal.

14. The power amplification circuit according to claim 10, further comprising:

a second amplification transistor, wherein a third signal is input to a base or gate of the second amplification transistor, and the first signal, which is obtained by amplifying the third signal, is output from a collector or a drain of the second amplification transistor; and a second bias circuit that supplies a third bias current to a base or gate of the second amplification transistor;

wherein the second bias circuit includes a third transistor, wherein the power supply voltage is supplied to a collector or drain of the third transistor, a second prescribed voltage is supplied to a base or gate of the third transistor, and the third bias current is output from an emitter or source of the third transistor, and a fourth control circuit that controls an electrical connection between the emitter or source of the third transistor and ground, wherein the fourth control circuit includes a third resistor and a third switch connected in series with each other, and wherein the third switch is on when the power amplification circuit is in the high power mode and is off when the power amplification circuit is in the low power mode, the third switch being controlled in accordance with the control signal.

15. The power amplification circuit according to claim 11, further comprising:

a second amplification transistor, wherein a third signal is input to a base or gate of the second amplification transistor, and the first signal, which is obtained by amplifying the third signal, is output from a collector or a drain of the second amplification transistor; and a second bias circuit that supplies a third bias current to a base or gate of the second amplification transistor;

wherein the second bias circuit includes
a third transistor, wherein the power supply voltage is supplied to a collector or drain of the third transistor, a second prescribed voltage is supplied to a base or gate of the third transistor, and the third bias current is output from an emitter or source of the third transistor, and a fourth control circuit that controls an electrical connection between the emitter or source of the third transistor and ground, wherein the fourth control circuit includes a third resistor and a third switch connected in series with each other, and wherein the third switch is on when the power amplification circuit is in the high power mode and is off when the power amplification circuit is in the low power mode, the third switch being controlled in accordance with the control signal.

16. The power amplification circuit according to claim 12, further comprising:

a second amplification transistor, wherein a third signal is input to a base or gate of the second amplification transistor, and the first signal, which is obtained by amplifying the third signal, is output from a collector or a drain of the second amplification transistor; and a second bias circuit that supplies a third bias current to a base or gate of the second amplification transistor;

wherein the second bias circuit includes
a third transistor, wherein the power supply voltage is supplied to a collector or drain of the third transistor, a second prescribed voltage is supplied to a base or gate of the third transistor, and the third bias current is output from an emitter or source of the third transistor, and a fourth control circuit that controls an electrical connection between the emitter or source of the third transistor and ground, wherein the fourth control circuit includes a third resistor and a third switch connected in series with each other, and wherein the third switch is on when the power amplification circuit is in the high power mode and is off when the power amplification circuit is in the low power mode, the third switch being controlled in accordance with the control signal.

* * * * *